United States Patent
Bluck et al.

(10) Patent No.: US 9,525,099 B2
(45) Date of Patent: Dec. 20, 2016

(54) DUAL-MASK ARRANGEMENT FOR SOLAR CELL FABRICATION

(71) Applicant: Intevac, Inc., Santa Clara, CA (US)

(72) Inventors: Terry Bluck, Santa Clara, CA (US); Ian Latchford, Palo Alto, CA (US); Vinay Shah, San Mateo, CA (US); Alex Riposan, Palo Alto, CA (US)

(73) Assignee: INTEVAC, INC., Santa Clara, CA (US)

( * ) Notice: Subject to any disclaimer, the term of this patent is extended or adjusted under 35 U.S.C. 154(b) by 19 days.

(21) Appl. No.: 13/866,856

(22) Filed: Apr. 19, 2013

(65) Prior Publication Data

US 2013/0276978 A1      Oct. 24, 2013

Related U.S. Application Data

(60) Provisional application No. 61/635,804, filed on Apr. 19, 2012, provisional application No. 61/639,052, filed on Apr. 26, 2012.

(51) Int. Cl.
*C23C 14/04* (2006.01)
*C23C 14/50* (2006.01)
(Continued)

(52) U.S. Cl.
CPC .......... *H01L 31/1892* (2013.01); *C23C 14/042* (2013.01); *C23C 14/50* (2013.01);
(Continued)

(58) Field of Classification Search
CPC ...... B25J 11/00; B25J 11/0095; C23C 14/042; C23C 16/042; C23C 16/4586;
(Continued)

(56) References Cited

U.S. PATENT DOCUMENTS 3,498,711 A * 3/1970 Ables .................... G03B 27/44
101/DIG. 36
3,775,644 A   11/1973 Cotner et al.
(Continued)

FOREIGN PATENT DOCUMENTS

CN     1662978 A    8/2005
CN     1818719 A    8/2006
(Continued)

OTHER PUBLICATIONS

J.W. Fiepke, "Permanent Magnet Materials," ASM Handbook vol. 2: Properties and Selection: Nonferrous Alloys and Special-Purpose Materials, (1990) ASM International. pp. 782-803.*
(Continued)

*Primary Examiner* — Parviz Hassanzadeh
*Assistant Examiner* — Stanislav Antolin
(74) *Attorney, Agent, or Firm* — Nixon Peabody LLP; Joseph Bach, Esq.

(57) ABSTRACT

An arrangement for supporting substrates during processing, having a wafer carrier with a susceptor for supporting the substrate and confining the substrate to predetermined position. An inner mask is configured for placing on top of the substrate, the inner mask having an opening pattern to mask unprocessed parts of the substrate, but expose remaining parts of the substrate for processing. An outer mask is configured for placing on top of the inner mask, the outer mask having an opening that exposes the part of the inner mask having the opening pattern, but cover the periphery of the inner mask.

19 Claims, 5 Drawing Sheets

(51) Int. Cl.
*C23C 16/04* (2006.01)
*C23C 16/458* (2006.01)
*H01L 21/673* (2006.01)
*H01L 31/18* (2006.01)

(52) U.S. Cl.
CPC ........ *C23C 16/042* (2013.01); *C23C 16/4585* (2013.01); *H01L 21/6734* (2013.01); *H01L 21/67346* (2013.01); *H01L 31/18* (2013.01)

(58) Field of Classification Search
CPC ........ C23C 14/04; C23C 14/05; C23C 16/04; C23C 16/4583; C23C 16/4585; C23C 16/4587; G03F 1/144; G03F 1/40; G03F 1/66; G03F 7/70541; G03F 7/70741; G03F 1/00–1/92; G03F 7/16–7/18; G03F 7/70691–7/70791; G03F 7/70733; G03F 7/7075; G03F 7/70716; G03F 7/04; G03F 7/0263; G09F 7/04; H01F 7/0263; H01J 2237/2001; H01J 37/32; H01J 2229/07; H01J 2229/0716; H01J 2229/0722; H01J 2229/0727; H01J 2229/0766; H01J 2229/0772; H01J 2229/0794; H01L 31/18; H01L 31/1892; H01L 51/0011; H01L 21/673–21/67396; H01L 21/67736; H01L 21/67754; H01L 21/67709; H01L 21/67784–21/67796; H01L 21/68; H01L 21/68714; H01L 21/68728; H01L 21/68735; H01L 21/68742; H01L 21/6875; H01L 21/68764; H01L 21/68778; H01L 21/68785; H01L 21/68771; H01L 27/3295; H01L 21/67703–21/67781; H05K 3/143; H05K 3/0073; H05K 3/0076; H05K 3/0079; Y02E 10/50; Y10S 414/136; Y10S 414/141; B05C 21/005
USPC ... 118/500, 505, 715, 721, 729; 156/345.27, 156/345.3, 345.52, 345.53; 427/143, 272, 427/282, 445, 468, 294
See application file for complete search history.

(56) References Cited

U.S. PATENT DOCUMENTS

| | | | |
|---|---|---|---|
| 4,475,223 A | 10/1984 | Taniguchi et al. | |
| 4,599,970 A * | 7/1986 | Peterson | 118/504 |
| 4,699,555 A | 10/1987 | Guarino | |
| 4,913,789 A * | 4/1990 | Aung | 204/192.3 |
| 4,915,057 A | 4/1990 | Boudreau et al. | |
| 4,915,564 A | 4/1990 | Eror et al. | |
| 5,164,974 A | 11/1992 | Kariya et al. | |
| 5,567,267 A | 10/1996 | Kazama et al. | |
| 5,688,389 A | 11/1997 | Bjornard et al. | |
| 5,846,328 A | 12/1998 | Aruga et al. | |
| 5,993,614 A | 11/1999 | Nomura | |
| 6,083,566 A | 7/2000 | Whitesell | |
| 6,084,494 A * | 7/2000 | Chew et al. | 335/283 |
| 6,146,489 A * | 11/2000 | Wirth | 156/280 |
| 6,251,232 B1 | 6/2001 | Aruga et al. | |
| 6,291,114 B1 | 9/2001 | Reijers | |
| 6,475,287 B1 * | 11/2002 | Clark | 118/721 |
| 6,589,382 B2 * | 7/2003 | Clark et al. | 156/304.3 |
| 7,429,300 B2 * | 9/2008 | Kido et al. | 118/719 |
| 7,785,663 B2 * | 8/2010 | Kido et al. | 427/248.1 |
| 8,349,196 B2 * | 1/2013 | Fairbairn et al. | 216/22 |
| 8,378,318 B1 | 2/2013 | Gammel et al. | |
| 9,082,799 B2 | 7/2015 | Weaver et al. | |
| 2002/0011406 A1 * | 1/2002 | Shishido et al. | 204/192.12 |
| 2002/0179013 A1 * | 12/2002 | Kido et al. | 118/718 |
| 2002/0187265 A1 * | 12/2002 | Mori et al. | 427/282 |
| 2003/0074097 A1 | 4/2003 | Mautz et al. | |
| 2003/0087471 A1 * | 5/2003 | Shtein | C23C 14/042 438/82 |
| 2003/0108805 A1 * | 6/2003 | Clark | C23C 14/042 430/22 |
| 2003/0221614 A1 * | 12/2003 | Kang et al. | 118/504 |
| 2004/0020435 A1 * | 2/2004 | Tsuchiya et al. | 118/723 VE |
| 2004/0037732 A1 * | 2/2004 | Shiga et al. | 420/94 |
| 2004/0049308 A1 * | 3/2004 | Evers | C23C 14/566 700/121 |
| 2004/0115342 A1 * | 6/2004 | Shigemura | 427/143 |
| 2004/0168634 A1 * | 9/2004 | Mori et al. | 118/719 |
| 2005/0034673 A1 * | 2/2005 | Kim | 118/728 |
| 2005/0232734 A1 * | 10/2005 | Elliott et al. | 414/411 |
| 2006/0150910 A1 * | 7/2006 | Han et al. | 118/721 |
| 2006/0187431 A1 | 8/2006 | Shibazaki | |
| 2006/0201618 A1 * | 9/2006 | Kang et al. | 156/285 |
| 2006/0266718 A1 * | 11/2006 | Tischner et al. | 211/41.18 |
| 2007/0009671 A1 * | 1/2007 | Manz | 427/468 |
| 2008/0299296 A1 * | 12/2008 | Kido et al. | 427/70 |
| 2009/0016857 A1 | 1/2009 | Nakamura | |
| 2009/0017192 A1 * | 1/2009 | Matsuura | 427/66 |
| 2009/0145879 A1 * | 6/2009 | Fairbairn et al. | 216/22 |
| 2009/0179651 A1 | 7/2009 | Elgar et al. | |
| 2009/0185892 A1 | 7/2009 | Aburatani | |
| 2009/0194026 A1 | 8/2009 | Burrows et al. | |
| 2009/0250574 A1 * | 10/2009 | Fullerton et al. | 248/206.5 |
| 2009/0291610 A1 * | 11/2009 | Sasaki | 445/24 |
| 2009/0324379 A1 * | 12/2009 | He | C23C 16/45519 414/800 |
| 2010/0003768 A1 * | 1/2010 | Barnes et al. | 438/4 |
| 2010/0092668 A1 * | 4/2010 | Hegedus | C23C 16/301 427/255.28 |
| 2010/0111650 A1 | 5/2010 | Quach et al. | |
| 2010/0120233 A1 * | 5/2010 | He | C23C 16/45519 438/478 |
| 2010/0296903 A1 | 11/2010 | Shah et al. | |
| 2011/0075145 A1 | 3/2011 | Dohse | |
| 2011/0141448 A1 | 6/2011 | Aoki et al. | |
| 2011/0174217 A1 * | 7/2011 | Gersdorff et al. | 118/500 |
| 2011/0207261 A1 * | 8/2011 | Watai | C23C 14/042 438/98 |
| 2011/0234344 A1 | 9/2011 | Fullerton et al. | |
| 2012/0006257 A1 | 1/2012 | Higashisaka et al. | |
| 2012/0048186 A1 * | 3/2012 | Bruning et al. | 118/500 |
| 2012/0170999 A1 | 7/2012 | Sakaue | |
| 2012/0199477 A1 * | 8/2012 | Uenosono | 204/298.15 |
| 2013/0071208 A1 | 3/2013 | Hosek | |
| 2013/0176691 A1 * | 7/2013 | Stevens et al. | 361/748 |
| 2013/0287526 A1 | 10/2013 | Bluck et al. | |
| 2015/0170947 A1 | 6/2015 | Bluck et al. | |
| 2016/0042913 A1 | 2/2016 | Adibi et al. | |

FOREIGN PATENT DOCUMENTS

| | | | |
|---|---|---|---|
| CN | 1861833 A | 11/2006 | |
| CN | 101864552 A | 10/2010 | |
| CN | 102165095 A | 8/2011 | |
| CN | 104582863 A | 4/2015 | |
| CN | 104685095 A | 6/2015 | |
| DE | 102008037387 A1 * | 3/2010 | C23C 16/04 |
| EP | 1365040 A1 | 11/2003 | |
| EP | 2423350 A1 * | 2/2012 | |
| EP | 2839052 A1 | 2/2015 | |
| EP | 2852469 A1 | 4/2015 | |
| JP | 2000-048954 A | 2/2000 | |
| JP | 2000-173769 A | 6/2000 | |
| JP | 2001-49422 A | 2/2001 | |
| JP | 2001-110567 A | 4/2001 | |
| JP | 2001-203079 A | 7/2001 | |
| JP | 2001-247961 A | 9/2001 | |
| JP | 2001-273979 A | 10/2001 | |
| JP | 2002-008859 A | 1/2002 | |
| JP | 2002-009098 A | 1/2002 | |
| JP | 2004214185 A * | 7/2004 | H05B 33/10 |
| JP | 2015-520799 A | 7/2015 | |
| JP | 2015-521373 A | 7/2015 | |

(56) References Cited

FOREIGN PATENT DOCUMENTS

| KR | 10-2015-0051935 A | 5/2015 |
|---|---|---|
| KR | 10-2015-0053733 A | 5/2015 |
| TW | 569284 B | 1/2004 |
| TW | 1229916 B | 3/2005 |
| TW | 1343087 B | 6/2011 |
| TW | 201130929 A | 9/2011 |
| TW | 1356467 B | 1/2012 |
| TW | 201349384 A | 12/2013 |
| TW | 201401412 A | 1/2014 |
| TW | 201541546 A | 11/2015 |
| TW | I518832 B | 1/2016 |
| TW | I518839 B | 1/2016 |
| WO | 99/61678 A1 | 12/1999 |
| WO | WO 2011024853 A1 * | 3/2011 |
| WO | 2013159050 A1 | 10/2013 |
| WO | 2013163622 A1 | 10/2013 |
| WO | 2015/127191 A1 | 8/2015 |
| WO | 2016/022728 A1 | 2/2016 |

OTHER PUBLICATIONS

Carpenter Technology Corporation, KOVAR® Alloy Technical Data Sheet, 1990.*
International Search Report and Written Opinion in PCT Application No. PCT/US2013/037464, mailed Sep. 6, 2013.
International Preliminary Report on Patentability in PCT Application No. PCT/US2013/037464, mailed Sep. 11, 2014.
Examination Report in Taiwanese Patent Application No. 102113908 dated Apr. 30, 2015.
Office Action in U.S. Appl. No. 13/871,871 dated Dec. 5, 2014.
Office Action in U.S. Appl. No. 13/871,871 dated Aug. 28, 2015.
International Search Report and Written Opinion in PCT Application No. PCT/US2013/038530, mailed Aug. 16, 2013.
International Preliminary Report on Patentability in PCT Application No. PCT/US2013/038530, mailed Nov. 6, 2014.
Extended Search Report for European Patent Application No. 13780965.3 dated Aug. 3, 2015.
Search and Examination Report for Singapore Patent Application No. 11201406893X dated Aug. 18, 2015.
Examination Report in Taiwanese Patent Application No. 102114999 dated Jul. 29, 2015.
Invitation to Pay Additional Fees for PCT/US2015/016799 dated Apr. 22, 2015.
International Search Report and Written Opinion for PCT/US2015/016799 dated Jun. 26, 2015.
Notice of Allowance in Taiwanese Patent Application No. 102113908 dated Sep. 30, 2015.
Office Action for Chinese Patent Application No. 201380033430.7 dated Oct. 23, 2015.
Notice of Allowance in Taiwanese Patent Application No. 102114999 dated Oct. 16, 2015.
International Search Report and Written Opinion for PCT/US2015/043884 dated Oct. 23, 2015.
Office Action in Chinese Patent Application No. 201380026127.4 dated Mar. 3, 2016.
Office Action in U.S. Appl. No. 13/871,871 dated Jan. 21, 2016.
Office Action in U.S. Appl. No. 14/819,402 dated Feb. 5, 2016.
Notice of Allowance in U.S. Appl. No. 13/871,871 dated Jun. 17, 2016.
Notice of Allowance in U.S. Appl. No. 14/819,402 dated Jun. 14, 2016.

* cited by examiner

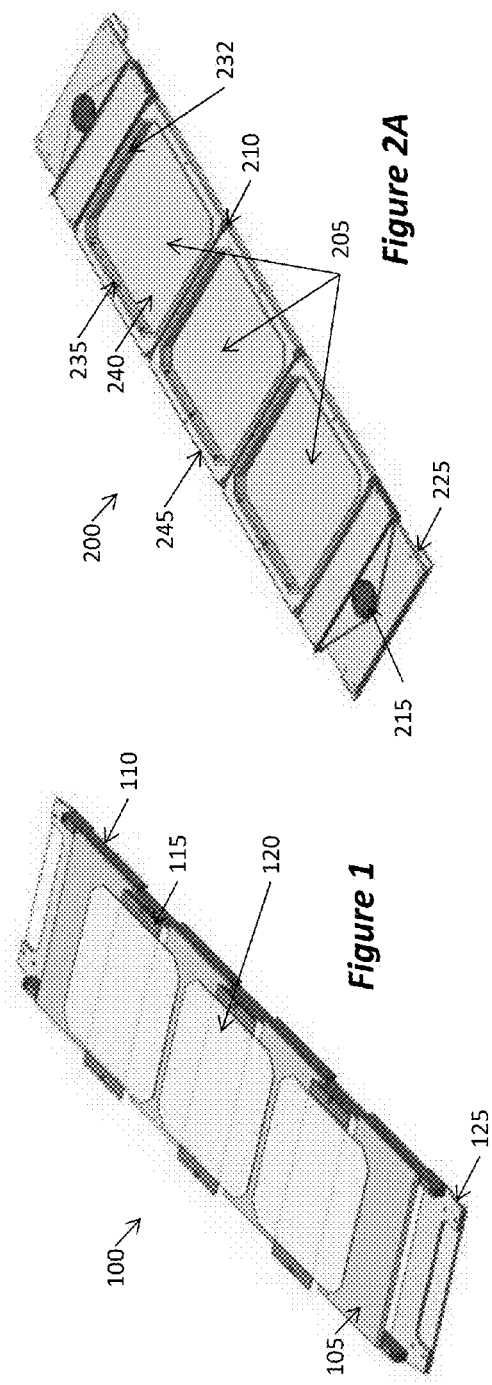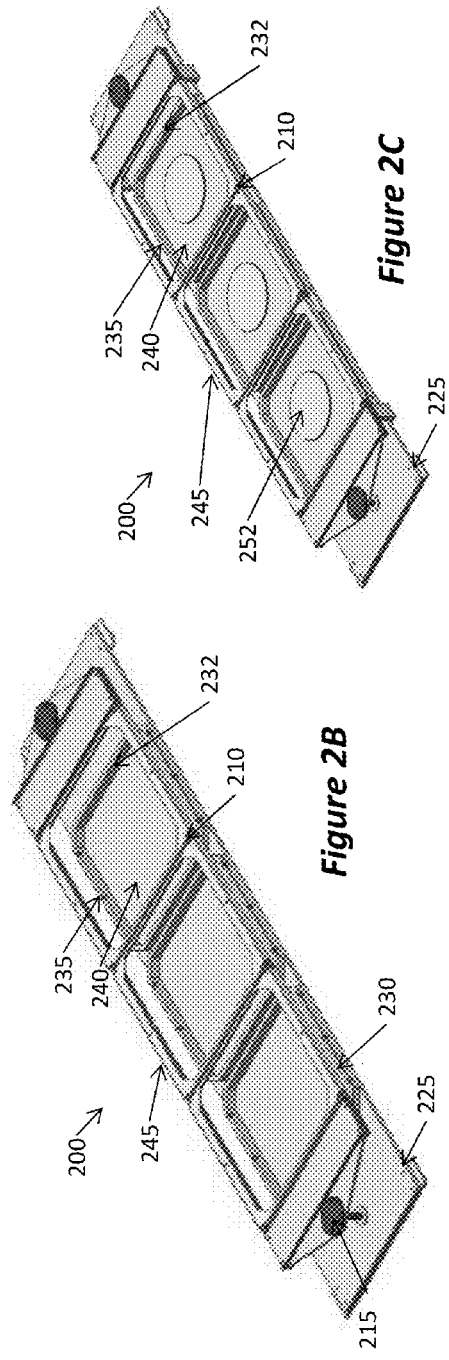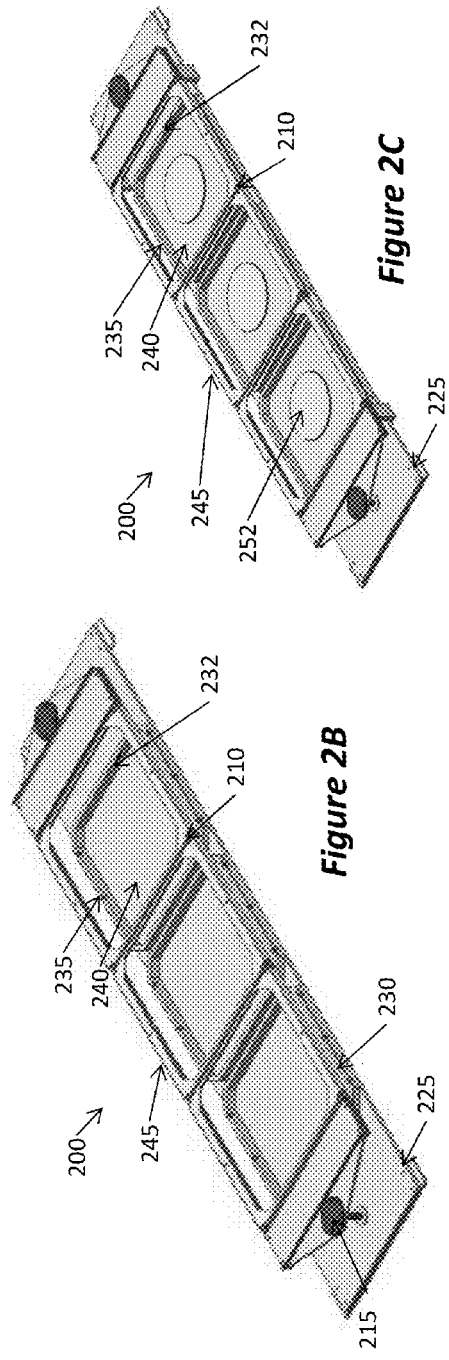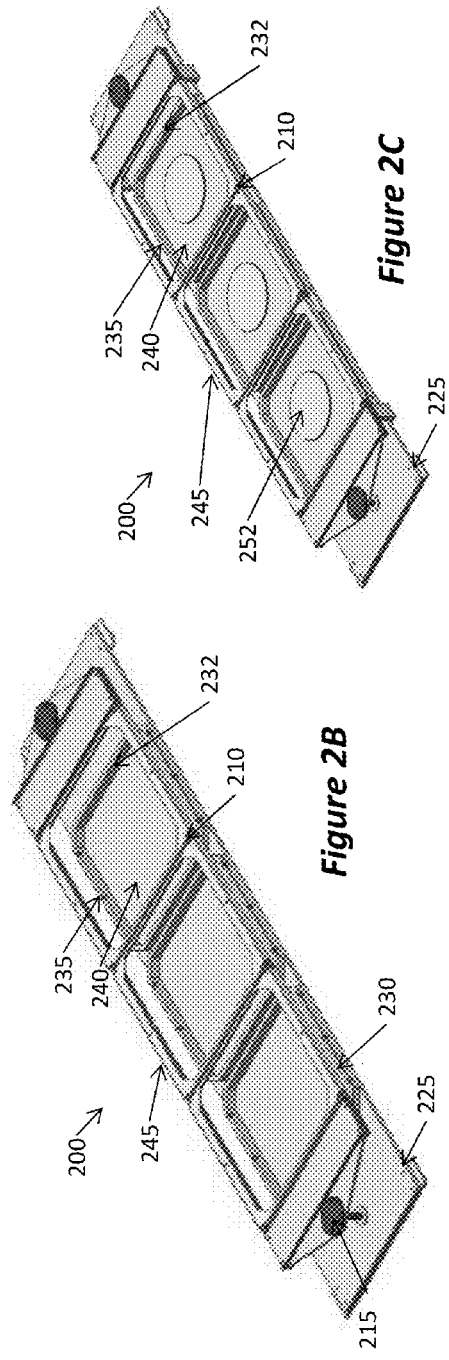

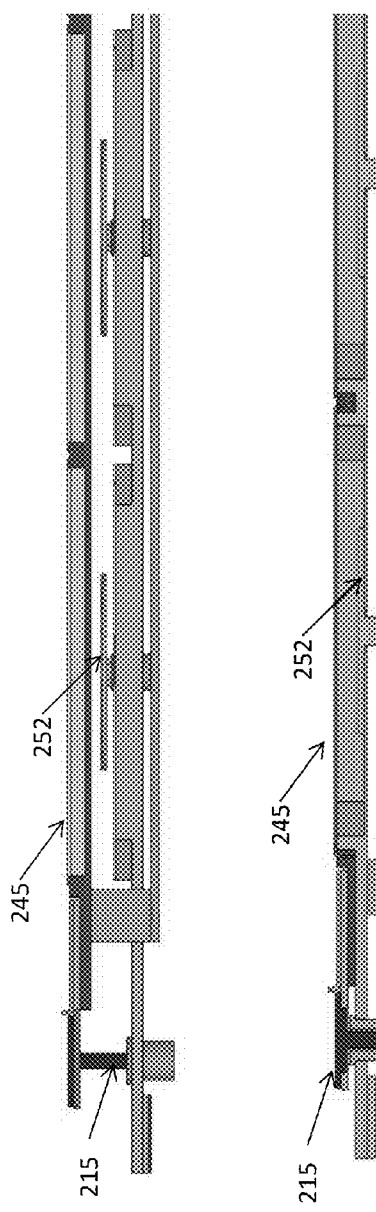
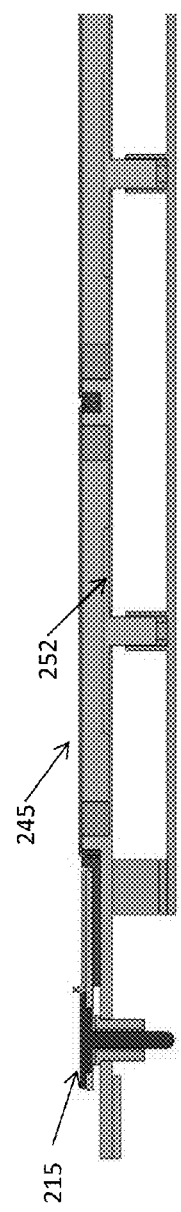
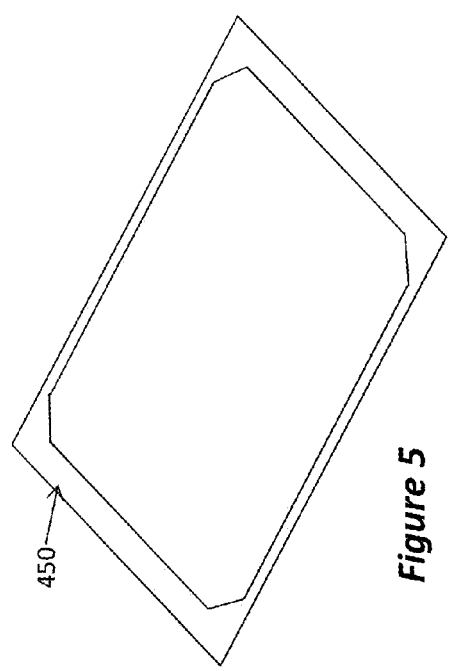
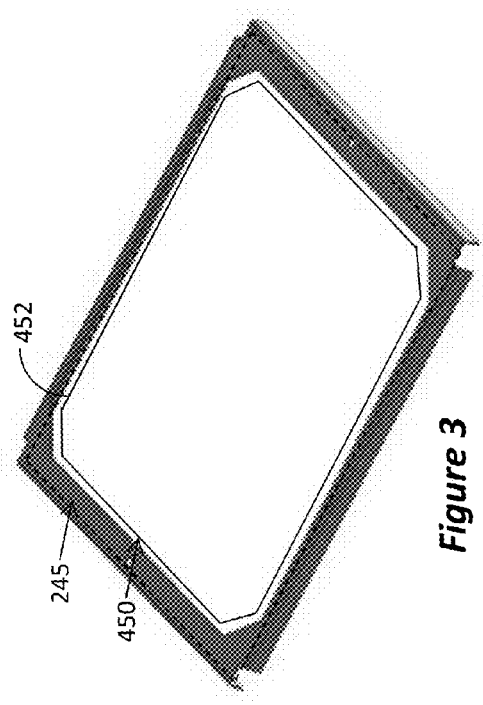

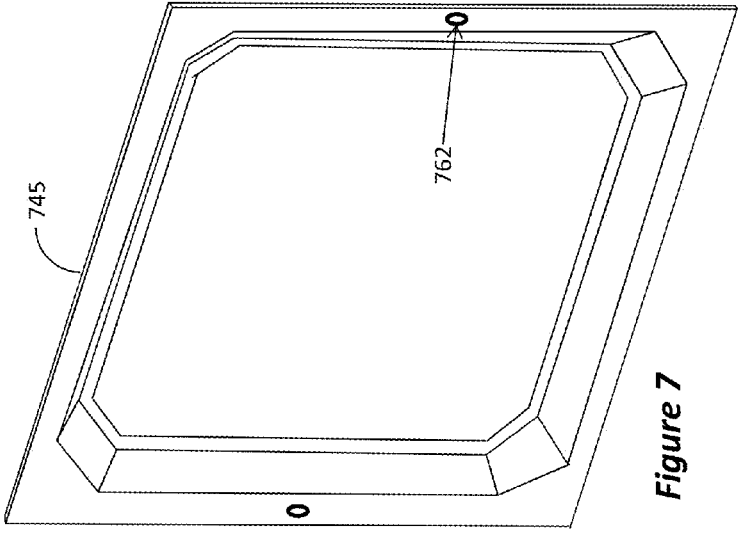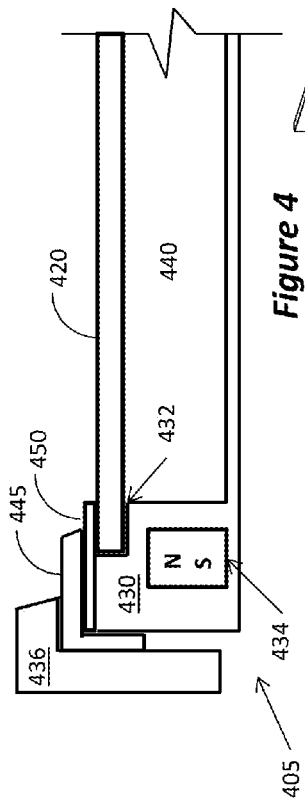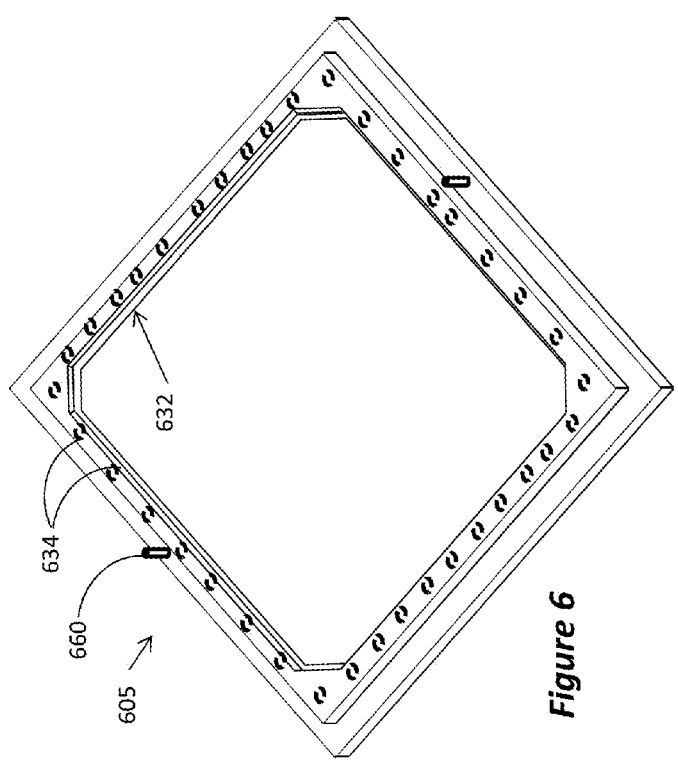

DUAL-MASK ARRANGEMENT FOR SOLAR CELL FABRICATION

RELATED APPLICATIONS

This application claims priority benefit from U.S. Provisional Application Ser. No. 61/635,804, filed Apr. 19, 2012, and U.S. Provisional Application Ser. No. 61/639,052, filed Apr. 26, 2012, the entire disclosure of which is incorporated herein by reference.

BACKGROUND

1. Field

This application relates to masking fabrication, such as using masks in the fabrication of solar cells.

2. Related Art

During various fabrication stages of solar cells, it may be desired to use masks so as to block parts of the solar cells from the particular fabrication process. For example, masks may be used for formation of contacts or for edge exclusion to preventing shunting of the cell. That is, for cells having contacts on the front and back sides, materials used for making the contacts may be deposited on the edges of the wafer and shunt the front and back contacts. Therefore, it is advisable to use mask to exclude the edges of the cell during fabrication of at least the front or back contacts.

As another illustration, for the fabrication of silicon solar cells, it is desirable to deposit blanket metals on the back surface to act as light reflectors and electrical conductors. The metal is typically aluminum, but the blanket metals could be any metal used for multiple reasons, such as cost, conductivity, solderability, etc. The deposited film thickness may be very thin, e.g., about 10 nm up to very thick, e.g., 2-3 um. However, it is necessary to prevent the blanket metal from wrapping around the edge of the silicon wafer, as this will create a resistive connection between the front and back surfaces of the solar cell, i.e., shunting. To prevent this connection, an exclusion zone on the backside edge of the wafer can be created. The typical dimension of the exclusion zone is less than 2 mm wide, but it is preferable to make the exclusion as thin as possible.

One way to create this exclusion zone is through the use of a mask; however, using masks has many challenges. Due to the highly competitive nature of the solar industry, the mask must be very cheap to manufacture. Also, due to the high throughputs of solar fabrication equipment (typically 1500-2500 cells per hour), the mask must be quick and easy to use in high volume manufacturing. Also, since the mask is used to prevent film deposition on certain parts of the wafer, it must be able to absorb and accommodate deposition build up. Furthermore, since film deposition is done at elevated temperatures, the mask must be able to function properly at elevated temperature, e.g., up to 350° C., while still accurately maintaining the exclusion zone width, while accommodating substrate warpage due to thermal stresses.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments of the invention solve the above problems of using masks, by using a dual-mask arrangement. The two part masking system is configured for masking semiconductor wafers, and includes an inner mask consisting of a flat metal sheet having apertures exposing the parts of the wafer that are to be processed; and, an outer mask configured for placing over and masking the inner mask, the outer mask having an opening cut of size and shape similar to the size and shape of the wafer, the outer mask having thickness larger than thickness of the inner mask. A mask frame may be configured to support the inner and outer masks, such that the outer mask is sandwiched between the mask frame and the inner mask. In one example, where the dual-mask arrangement is used for edge isolation, the opening cut in the inner mask is of size slightly smaller than the wafer, so that when the inner mask is placed on the wafer it covers peripheral edge of the wafer, and the opening cut in the outer mask is slightly smaller than the opening cut in of the inner mask. A top frame carrier may be used to hold the inner and outer mask and affix the inner and outer masks to the wafer susceptor.

An upper or outer mask may be made from thin, e.g., about 0.03", aluminum, steel or other similar material, and is configured to mate with a substrate carrier. An inner mask is made from a very thin, e.g., about 0.001 to 0.003", flat steel sheet, or other magnetic materials, and is configured to be nested within the outer mask.

According to further embodiments, arrangement for supporting wafers during processing is provided, comprising: a wafer carrier or susceptor having a raised frame, the raised frame having a recess for supporting a wafer around periphery of the wafer and confining the wafer to predetermined position; an inner mask configured for placing on top of the raised frame, the inner mask having an aperture arrangement configured to mask part of the wafer and expose remaining part of the wafer; and an outer mask configured for placing over the raised frame on top of the inner mask, the outer mask having a single opening configured to partially cover the inner mask. A top frame carrier may be used to hold the inner and outer mask and affix the inner and outer masks to the wafer susceptor.

Magnets are located in the susceptor and alternate N-S-N-S-N completely around the frame or completely below the entire surface of the susceptor and directly under the wafer. The outer and inner masks are designed to be held to the frame by magnetic forces only, so as to enable easy and fast loading and unloading of substrates.

The mask assembly is removable from the wafer carrier and support frame to load the substrate into the carrier. Both the outer and inner masks are lifted as part of the mask assembly. Once the wafer is located on the carrier in the wafer pocket, the mask assembly is lowered back down onto the carrier. The inner mask overlaps the top surface of the wafer. The magnets in the carrier frame pull the inner mask down into intimate contact with the substrate. This forms a tight compliant seal on the edge of the wafer. The outer mask is designed in order to prevent deposition on the thin compliant inner mask. As explained above, the deposition process might cause the inner mask to heat, causing the mask to warp and loose contact with the wafer. If the mask looses contact with the wafer the metal film will deposit in the exclusion zone on the surface of the substrate wafer. The pocket and friction force created by the magnets keep the substrate and mask from moving relative to each other during transport and deposition, and the outer mask prevents film deposition on the inner mask and prevents the inner mask from warping.

The mask assembly can be periodically removed from the system with the carrier by use of a vacuum carrier exchange. The carrier exchange is a portable vacuum enclosure with carrier transport mechanism. It allows the carriers to be exchanged "on the fly" without stopping the continuous operation of the system.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 illustrates a multi-wafer carrier according to one embodiment, which is not configured for mask processing.

FIGS. 2A-2E illustrate views of a multi-wafer carrier having an arrangement for dual-mask, according to various embodiments.

FIG. 3 illustrates an embodiment of the outer mask, with the inner mask nested therein.

FIG. 4 is a cross section of an enlarged part of the frame, outer and inner masks, according to one embodiment.

FIG. 5 illustrates an embodiment of the inner mask for use in edge isolation.

FIG. 6 illustrate an embodiment of the single wafer carrier.

FIG. 7 illustrate an embodiment of the outer mask, viewing from the underside.

DETAILED DESCRIPTION

Figure 4A:
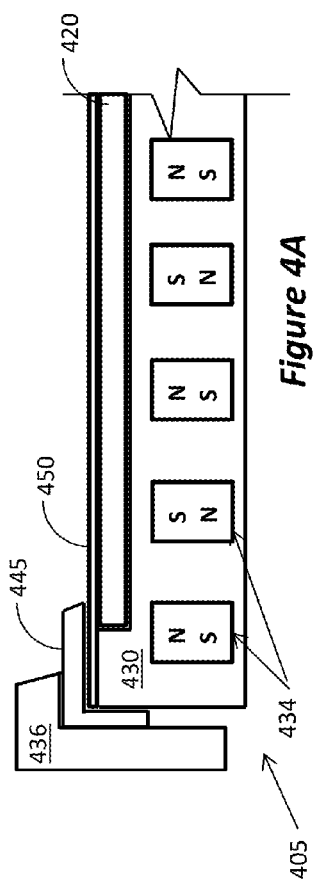
FIG. 4A illustrates another embodiment, which may be used, for example, for forming contact patterns on the back of a wafer.

While in traditional semiconductor manufacturing wafers are generally processed independently, in solar fabrication multiple wafers are fabricated simultaneously. For simplicity, the following will be described with respect to processing of three wafers simultaneously; however, it should be appreciated that the embodiments may be extended to any number of wafers being processed simultaneously.

FIG. 1 illustrates a multi-wafer carrier according to one embodiment, which is not configured for mask processing. That is, in the fabrication of solar cells, some of the processing steps do not require masking of the wafers. In such cases, the carrier of FIG. 1 can be used. Carriers which implement the dual-mask arrangement will be described below with reference to the remaining Figures. Thus, in various embodiments, processing steps that do not require masking would be performed using the carriers of FIG. 1, while processing steps that require masking would be performed sing the carriers such as those shown in the remaining Figures. As shown in FIG. 1, the construction of the multi-wafer carrier according to this embodiment is rather simple and inexpensive. While in FIG. 1 the carrier is shown configured for transporting three wafers, it should be appreciated that the carrier can be configured for a different number of wafers. Also, it should be appreciated that each processing chamber may be configured to accommodate several carriers simultaneously, thus processing multiple wafers on multiple carriers simultaneously.

The carrier 100 of FIG. 1 is constructed of a simple plate forming susceptor 105 made of, e.g., aluminum nitride, which is supported by a ceramic frame or ceramic bars 110. The ceramic frame 110 improves thermal isolation of the susceptor 105 from the remaining parts of the chamber. One lifter plate 115 is provided under each wafer 120, so that the wafer can be lifted off of the susceptor 105. Transport rails 125 are provided on each side of the frame 110, to enable transporting the carrier throughout the system.

When processing of the wafers requires the use of masks, the masks may be placed individually on top of each wafer, or one mask may be formed to cover all three wafers simultaneously. The mask may be held in place using, e.g., magnets. However, for accurate processing the mask must be made very thin, and consequently may deform due to thermal stresses during processing. Additionally, a thin mask may collect deposits rapidly and the deposits may interfere with the accurate placing and masking of the mask. Therefore, it would be advantageous to use the dual-mask arrangement according to the embodiments disclosed below.

FIGS. 2A-2E illustrate views of a multi-wafer carrier having an arrangement for dual-mask, according to various embodiments. FIG. 2A illustrates a multi-wafer carrier with dual-masks arrangement, wherein the mask arrangement is in the lower position such that the inner mask is in intimate physical contact with the wafer; FIG. 2B illustrates a multi-wafer carrier with dual-masks arrangement, wherein the mask arrangement is in the elevated position thereby enabling replacement of the wafers; FIG. 2C illustrates a multi-wafer carrier with dual-masks arrangement, wherein wafer lifters are included for loading/unloading wafers; FIG. 2D illustrates a partial cross-section of a multi-wafer carrier with dual-masks arrangement, wherein the mask arrangement and the wafer lifters are in the elevated position; and FIG. 2E illustrates a partial cross-section of a multi-wafer carrier with dual-masks arrangement, wherein the mask arrangement and the wafer lifter are in the lower position.

Referring to FIG. 2A, the multi-wafer carrier, also referred to as carrier support 200 has three separate single-wafer carriers or susceptors 105, which are supported by a susceptor frame or bars 110, made of, e.g., ceramic. Each single-wafer carrier 105 is configured for holding a single wafer together with a dual-mask arrangement. In FIG. 2A the dual-mask arrangement is in a lowered position, but no wafer is situated in any of the carriers, so as to expose the carriers' construction. In FIG. 2B the dual-mask arrangement is shown in the lifted position, again without wafers in any of the carriers. In the embodiments of FIGS. 2A-2E a lifter 215 is used to lift and lower the dual-mask arrangement; however, for lower cost and less complication, lifter 215 may be eliminated and the dual-mask arrangement may be lifted manually. As in FIG. 1, transport rails 225 are provided on each side of the frames 210, to enable transporting the carrier 200 throughout the system.

Each of single-wafer carriers 205 has a base 230 (visible in FIG. 2B), which has a raised frame 232 with a recess 235 to support a wafer suspended by its periphery. The base 230 with the frame 232 form a pocket 240 below the suspended wafer, which is beneficial for capturing broken wafer pieces. In some embodiments, the frame 232 is separable from the base 230. Outer mask 245 is configured to be mounted on the frame 232, so as to cover the frame 232 and cover the periphery of the inner mask, but expose the central part of the inner mask which corresponds to the wafer. This is exemplified by the cross-section illustration in the embodiment of FIG. 4.

In FIG. 4, base or susceptor 405 has raised frame 430 with recess 432, which supports wafer 420 at its periphery. The base 405 with frame 430 forms pocket 440, and the wafer is suspended above the pocket. A series of magnets 434 are positioned inside the raised frame 430, so as to surround the periphery of the wafer 420. In some embodiments, especially for high temperature operations, the magnets 434 may be made of Samarium Cobalt (SmCo). Inner mask 450 is positioned on top of the raised frame 430 and the wafer 420, and is held in place by magnets 434, such that it physically contacts the wafer. Outer mask 445 is placed over and physically contacts the inner mask 450, such that it covers the periphery of the inner mask 450, except for the area of the inner masks that is designed for imparting the process to the wafer. An example of outer mask 245 is shown in FIG. 3, in this example made of a folded sheet of aluminum, wherein the inner mask is covered by the outer mask, except for a small peripheral edge 452, since the example is for an edge shunt isolation processing. An example of the inner mask for edge shunt isolation is illustrated in FIG. 5, which is basically a flat sheet of metal having an aperture of size and shape as that of the wafer, except that it is slightly smaller, e.g., 1-2 mm smaller than the size of the wafer. In the embodiment of FIG. 4, mask frame 436 is provided to enable supporting and lifting of the inner and outer mask off of the carrier. In such a configuration, the outer mask is sandwiched between the mask frame 436 and the inner mask 450.

FIG. 4A illustrates another embodiment, which may be used, for example, for forming contact patterns on the back of a wafer. In this embodiment, the susceptor forms a top platform to support the wafer on its entire surface. Magnets 434 are embedded over the entire area of the susceptor below the top surface of the susceptor. The inner mask 450 covers the entire surface of the wafer 420 and has plurality of holes according to the contact design.

Turning back to FIGS. 2A-2E, lifter 215 can be used to raise the outer mask, together with the inner mask. Also, wafer lifter 252 can be used to lift the wafer off of the frame 230, so that it could be replaced with a fresh wafer for processing, using a robot arm. However, lifters 215 and 252 can be eliminated and the operations of lifting the masks and replacing the wafer may be done manually instead.

In the embodiments described above with reference to FIG. 4, the carrier supports the wafer on its peripheral edge, such that the wafer is suspended. The pocket formed below the wafer traps broken wafer pieces and prevents wraparound of deposited material. On the other hand, in the embodiment of FIG. 4A the wafer is supported over its entire surface. The mask assembly is lowered in place for sputter or other form of processing, and is lifted, manually or mechanically, for loading and unloading of wafers. A series of magnets on the carrier help secure the inner mask in place and in tight contact with the wafer. After repeated uses, the outer and inner masks can be replaced, while the rest of the carrier assembly can be reused. The frame 210, also referred to as mask assembly side bars, may be made from low thermal expansion material, such as Alumina or Titanium.

According to the above embodiments, the inner mask establishes an intimate gap free contact with the substrate. The outer mask protects the inner mask, the carrier and the frame from deposited material. In the embodiments illustrated, the outer and inner mask openings are in a pseudo-square shape, suitable for applications to mono-crystalline solar cells during edge shunt isolation process. During other processes the inner mask has a certain apertures arrangement, while the outer mask has the pseudo-square shaped aperture. Pseudo-square shape is a square with its corners cut according to a circular ingot from which the wafer was cut. Of course, if poly-crystalline square wafers are used, the outer and inner mask openings would be square as well.

FIG. 6 illustrate an embodiment of the single wafer carrier 605. The wafer rests at its periphery on recess 632. Magnets 634, shown in broken line, are provided inside the carrier all around the wafer. Alignment pins 660 are used to align the outer mask to the carrier 605. An embodiment of the outer mask is shown in FIG. 7, viewing from the underside. The outer mask 745 has alignment holes or recesses 762 corresponding to the alignment pins 660 of the carrier 605.

Figure 8:
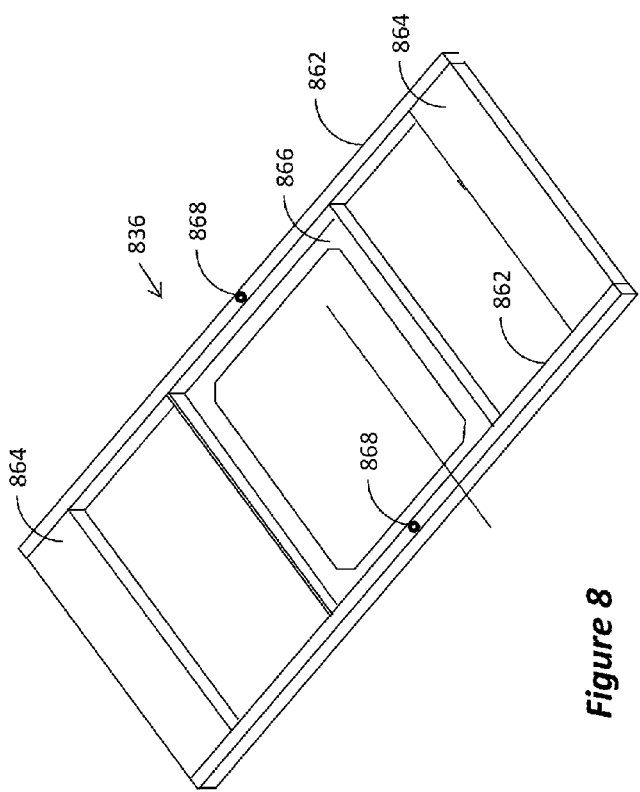
FIG. 8 illustrates an embodiment of a top frame to support the inner and outer masks.

FIG. 8 illustrates an embodiment of a top frame 836 used to hold the outer and inner masks and secure the masks to the susceptor. The top frame 836 may be made by, e.g., two longitudinal bars 862, held together by two traverse bars 864. The outer mask is held inside pocket 866. Alignment holes 868 are provided to align the top frame to the susceptor.

Figure 9:
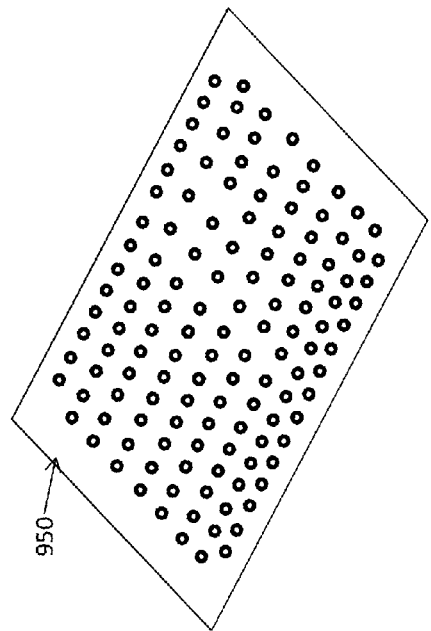
FIG. 9 illustrates an embodiment of the inner mask for creating plurality of holes in the wafer.

FIG. 9 illustrates an example of an inner mask with a hole-pattern designed, for example, for fabricating plurality of contacts on the wafer. Such an inner mask can be used with the susceptor shown in FIG. 10, wherein the magnets 1034 are distributed over the entire area below the surface of the wafer. The magnets are oriented in alternating polarization. In this embodiment, it is not necessary to have the raised frame in the susceptor, but it rather may be form as a flat platform, as shown in the example of FIG. 10A

Figures 10, 10A:
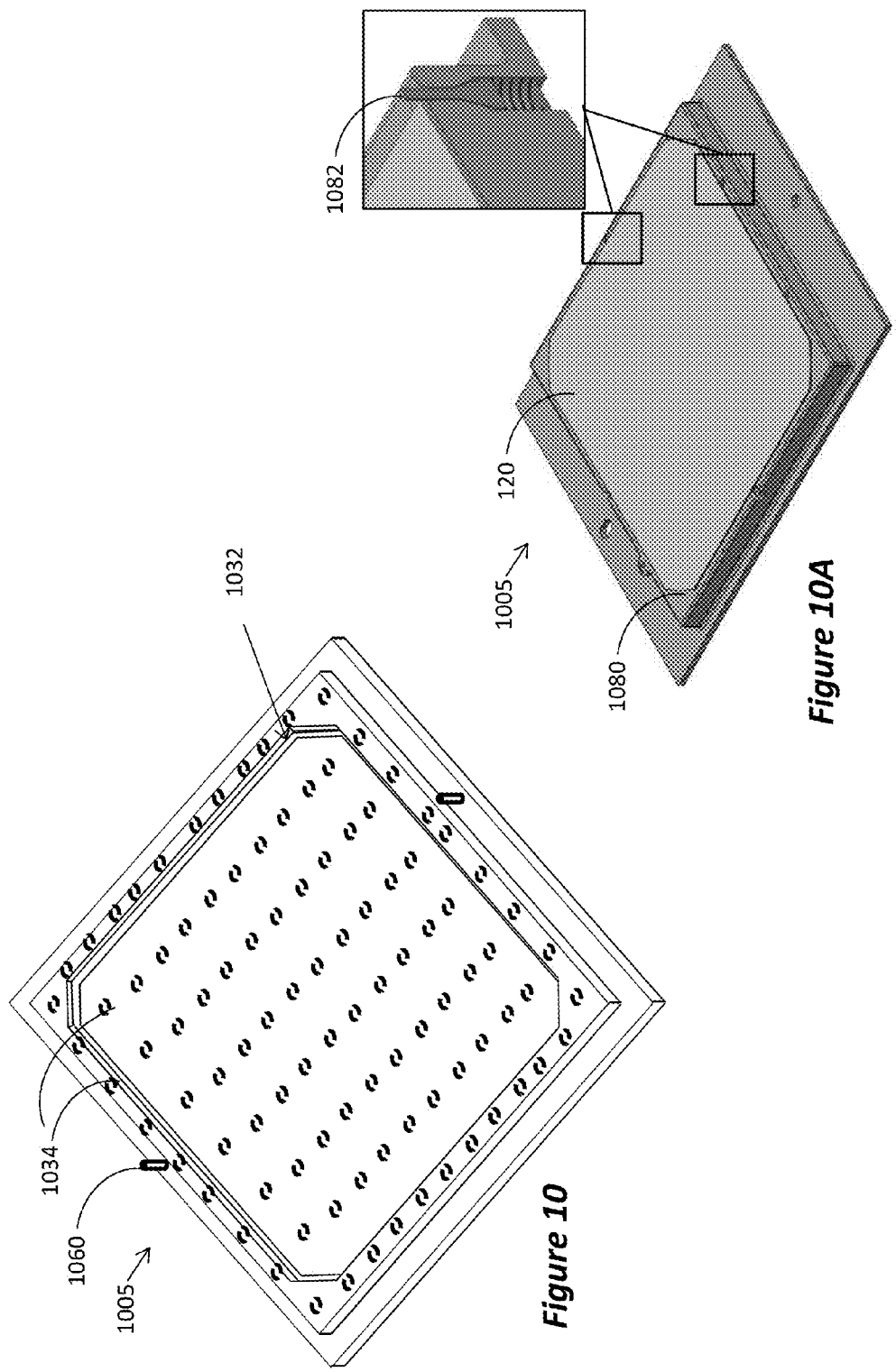
FIG. 10 illustrates an embodiment of the susceptor for use with the mask of FIG. 9.
FIG. 10A illustrates an embodiment of the susceptor in the form of an electrostatic chuck having spring loaded alignment pins.

FIG. 10A illustrates an embodiment of the susceptor 1005 in the form of an electrostatic chuck (ESC) 1080. In this embodiment, the top of the ESC 1080 is a flat plateau and has no raised frame and no pocket for catching broken substrate pieces. Additionally, in this embodiment, spring loaded alignment pins 1082 are provided to enable accurate alignment of the substrate 120. When the mask is placed over the substrate, it compresses the alignment pins 1082 so as to lie flat on the substrate. The alignment pins are provided on two sides only: one pin on one side and two pins on another side that is oriented at 90 degrees to the first side. The substrate can then be urged against these pins to align the substrate.

As can be understood from the embodiments described above, the inner magnetic mask should be thin so it is flexible and will conform to the substrate surface. The substrate holder can be a frame, an electrostatic chuck, a flat plate, etc., as long as it has magnets imbedded under the substrate to hold the inner mask in contact with the substrate. The magnets would be along the mask opening for an open area mask, such as one that only masks the outer edge of a wafer for edge isolation. For a mask with holes over the substrate's surface, the magnets would be in an array under the mask over the entire area of the mask. The dual-mask arrangement could be used for various processes, such as, e.g., deposition, implantation, RIE processing, etc. For instance a touch panel could be made by blanket deposition of ITO followed by a RIE process to pattern the ITO thru a mask.

While this invention has been discussed in terms of exemplary embodiments of specific materials, and specific steps, it should be understood by those skilled in the art that variations of these specific examples may be made and/or used and that such structures and methods will follow from the understanding imparted by the practices described and illustrated as well as the discussions of operations as to facilitate modifications that may be made without departing from the scope of the invention defined by the appended claims.

The invention claimed is:

1. An arrangement for processing wafers in a vacuum processing system using masks, comprising:
   a wafer carrier, configured for simultaneously supporting a plurality of wafers during processing inside the vacuum processing system, and comprising a carrier frame and two transport rails each provided on a corresponding edge of the carrier frame, the transport rails configured to transport the wafer carrier throughout the vacuum processing system;
   a plurality of susceptors attached to the carrier frame, each susceptor configured to support a single wafer;
   a plurality of inner masks, each configured for placing on top of one of the wafers supported by one of the susceptors, each inner mask having an opening-pattern to mask parts of the wafer and expose remaining parts of the wafer;
   a plurality of outer masks, each configured for placing on top of a corresponding inner mask, each outer mask having an opening configured to partially cover the corresponding inner mask;
   a mask frame configured to support and lift the plurality of inner masks and the plurality of outer masks off of the wafer carrier, and to secure the plurality of inner and outer masks to the respective susceptor.

2. The arrangement of claim 1, wherein each of the inner masks consists of a flat metal sheet having the opening cut of size slightly smaller than the wafer, so that when the inner mask is placed on the wafer it covers peripheral edge of the wafer.

3. The arrangement of claim 2, wherein each of the inner masks is made of steel.

4. The arrangement of claim 2, wherein each of the inner mask has a thickness of 0.001 to 0.003 inches.

5. The arrangement of claim 1, further comprising a plurality of magnets imbedded in each of the susceptors and configured to pull the respective inner mask into contact with the corresponding wafer.

6. The arrangement of claim 5, wherein each of the outer masks is made of magnetic material for shunting the magnetic fields from the magnets and for keeping the outer mask in contact with the respective inner mask.

7. The arrangement of claim 5, wherein the plurality of magnets are made of Samarium Cobalt.

8. The arrangement of claim 5, wherein the magnets imbedded in each of the susceptors alternate N-S.

9. The arrangement of claim 1, wherein each of the outer masks is made from aluminum and rests in physical contact on top of the respective inner mask.

10. The arrangement of claim 1, wherein each of the susceptors comprises an electrostatic chuck.

11. The arrangement of claim 10, wherein the carrier frame comprises ceramic bars holding the plurality of susceptors.

12. The arrangement of claim 10, wherein the vacuum processing system comprises at least one reactive ion etch (RIE) chamber and the rails are configured for transporting the wafer carriers through the RIE chamber.

13. The arrangement of claim 10, wherein the wafer carrier further comprises mask lifters configured for engaging the mask frame to thereby lift the outer and inner masks off of the wafer carrier.

14. The arrangement of claim 10, wherein the wafer carrier further comprises wafer lift pins configured for lifting the wafers off of the susceptors.

15. The arrangement of claim 1, wherein the outer and inner masks are configured to be held to the wafer carrier by magnetic forces only, so as to enable easy and fast loading and unloading of wafers.

16. The arrangement of claim 1, wherein the each of the susceptors comprises a raised frame having a recess which defines a pocket below the wafer, such that the wafer is suspended above the pocket by the wafer's periphery resting on the recess.

17. The arrangement of claim 1, wherein the wafer carrier comprises alignment pins and each of the outer masks has corresponding alignment recesses.

18. The arrangement of claim 1, wherein each of the outer masks comprises a folded sheet of aluminum.

19. The arrangement of claim 1, wherein each of the inner masks is sandwiched between the mask frame and the corresponding outer mask.

* * * * *